US012473640B2

(12) United States Patent
Nakagawa et al.

(10) Patent No.: US 12,473,640 B2
(45) Date of Patent: Nov. 18, 2025

(54) SUPPLY SYSTEM FOR LOW VOLATILITY PRECURSORS

(71) Applicant: L'Air Liquide, Société Anonyme pour l'Etude et l'Exploitation des Procédés Georges Claude, Paris (FR)

(72) Inventors: Toshiyuki Nakagawa, Kobe (JP); Shingo Okubo, Tsukuba (JP); Kazuma Suzuki, Tsukuba (JP); Ikuo Suzuki, Tsukuba (JP); Koji Ishida, Tsukuba (JP); Takashi Kameoka, Tsukuba (JP); Kazutaka Yanagita, Tsukuba (JP); Mikio Goto, Minato (JP); Koji Matsumoto, Nagano (JP); Fumikazu Nozawa, Sakura (JP); Terumasa Koura, Tsukuba (JP); Kohei Tarutani, Tsukuba (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 130 days.

(21) Appl. No.: 17/766,497

(22) PCT Filed: Oct. 2, 2020

(86) PCT No.: PCT/US2020/054021
§ 371 (c)(1),
(2) Date: Apr. 4, 2022

(87) PCT Pub. No.: WO2021/067764
PCT Pub. Date: Apr. 8, 2021

(65) Prior Publication Data

US 2024/0052484 A1 Feb. 15, 2024

Related U.S. Application Data

(60) Provisional application No. 62/910,924, filed on Oct. 4, 2019.

(51) Int. Cl.
*C23C 16/44* (2006.01)
*C23C 16/448* (2006.01)
*C23C 16/455* (2006.01)

(52) U.S. Cl.
CPC .... *C23C 16/4485* (2013.01); *C23C 16/45557* (2013.01); *C23C 16/45561* (2013.01)

(58) Field of Classification Search
CPC .......... C23C 16/4485; C23C 16/45557; C23C 16/45561; C23C 16/4481
See application file for complete search history.

(56) References Cited

U.S. PATENT DOCUMENTS 5,630,878 A * 5/1997 Miyamoto .......... C23C 16/4485 118/725
7,050,708 B2 5/2006 Sandhu
(Continued)

FOREIGN PATENT DOCUMENTS

EP 0 931 861 7/1999
JP 2002 359238 12/2002
(Continued)

OTHER PUBLICATIONS

International Search Report and Written Opinion for corresponding PCT/US2020/054021, Feb. 8, 2021.

*Primary Examiner* — Kelsey E Cary
(74) *Attorney, Agent, or Firm* — Yan Jiang

(57) ABSTRACT

Supply system include a first vessel containing the precursor, a second vessel, a first gas conduit fluidically connecting the first vessel to the second vessel, wherein a pressure reduction device and a flow control device are fluidically mounted therein, a second gas conduit fluidically connecting the second vessel to a point of use, and a pressure gauge downstream the pressure reduction device for measuring a partial pressure of the precursor in the second vessel, wherein the partial pressure of the precursor in the second
(Continued)

vessel is at a pressure lower than the saturated vapor pressure of the precursor at the temperature of the second vessel and higher than an inlet pressure requirement of the flow control device at the point of use. Methods for using the supply system are also disclosed.

4 Claims, 13 Drawing Sheets

(56) References Cited

U.S. PATENT DOCUMENTS

| | | | | |
|---|---|---|---|---|
| 7,413,767 | B2 | 8/2008 | Bauch et al. | |
| 2001/0006705 | A1 * | 7/2001 | Takeshima ........ | C23C 16/45593 427/255.28 |
| 2003/0145789 | A1 | 8/2003 | Bauch et al. | |
| 2004/0164089 | A1 | 8/2004 | Ravetz et al. | |
| 2008/0018004 | A1 | 1/2008 | Steidl et al. | |
| 2008/0264072 | A1 * | 10/2008 | Miyoshi .................... | F17C 9/02 62/48.1 |
| 2011/0100483 | A1 | 5/2011 | Nagata et al. | |
| 2012/0000986 | A1 * | 1/2012 | Jeong ...................... | C23C 16/52 237/2 R |
| 2012/0094483 | A1 * | 4/2012 | Komiya ............ | C23C 16/45502 438/653 |
| 2014/0216339 | A1 * | 8/2014 | Nagase ............... | C23C 16/4485 118/712 |
| 2014/0356796 | A1 * | 12/2014 | Terasaka ............. | C23C 16/4485 432/13 |
| 2016/0115594 | A1 * | 4/2016 | Moroi ............... | C23C 16/45561 137/341 |
| 2017/0121814 | A1 * | 5/2017 | Caymax ............ | C23C 16/45561 |
| 2017/0159175 | A1 * | 6/2017 | Yagi .................... | C23C 16/4481 |
| 2017/0335450 | A1 | 11/2017 | Collins et al. | |
| 2018/0071702 | A1 * | 3/2018 | Hidaka ............... | C23C 16/4485 |

FOREIGN PATENT DOCUMENTS

| | | |
|---|---|---|
| TW | 527435 | 4/2003 |
| WO | WO 2006 101767 | 3/2006 |
| WO | WO 2010 083510 | 7/2010 |
| WO | WO 2012 176965 | 12/2012 |

* cited by examiner

SUPPLY SYSTEM FOR LOW VOLATILITY PRECURSORS

CROSS REFERENCE TO RELATED APPLICATIONS

This application is a 371 of International Application No. PCT/US2020/054021, filed Oct. 2, 2020, which claims priority to U.S. Application No. 62/910,924 filed Oct. 4, 2019, being incorporated herein by reference in its entirety for all purposes.

FIELD OF THE INVENTION

The present invention relates to systems and methods for a supply system suitable for low volatile precursors without using carrier gases.

BACKGROUND

A precursor supply system is one of the most important components for thin film deposition equipment as used for instance for manufactures of semiconductors, photovoltaic cells, flat panel displays, and in general for any deposition processes under reduced pressure, such as, powder coating, 3D object coatings, etc. Precursor materials are introduced as vapors into film formation tools to form thin films of pure and compound materials on a substrate. Both liquid and solid precursors have been utilized for semiconductor thin film formation processes.

Typically, when the vapor pressure of the precursor is low, the feed pressure to a process chamber under the precursor's own vapor pressure is insufficient for the deposition process in the absence of a carrier gas (insufficient to control the flow with a mass flow controller (MFC) for instance). As such, the vapor of a low volatility precursor dispensing to a process chamber is generally achieved by a combination of heating a precursor storage vessel and a delivery line to increase the vapor pressure and avoid condensation in the delivery line and using the carrier gas that generates the vapor of the carrier gas by passing in the precursor storage vessel, such as, bubbler, "cross flow", etc. Such delivery methods apply to both on-board configuration, i.e. when the precursor storage vessel is mounted inside process equipment, immediately next to the process chamber, and to remote delivery systems, where a large precursor storage vessel may feed one or more process chambers from a remote location through a heated delivery line. See for instance US20080018004A1. The usage of the carrier gas as such typically enables the dispense of a high flux of precursor at a reduced concentration, and at a sufficient pressure to operate a flow regulating device such as a mass flow controller.

While convenient for many processes, the usage of a carrier gas however induces the following issues in particular circumstances: i). For a given pressure in a deposition chamber (usually between 50 mtorr and 50 torr range), the partial pressure of the precursor is decreased owing to the dilution by the carrier gas. This translates into lower deposition rates, which affects the equipment throughput; and ii). At atomic scale, the carrier gas atoms or molecules diffuse faster and more easily, than larger precursor molecules, into nanometric size features or fine patterns, such as holes and trenches. This reduces the ability of the precursor to deposit uniformly across such very fine patterns.

If the usage of pure precursor vapor may thus be desired, the ability to feed such pure precursor vapors of low volatility compounds faces technical challenges. Firstly, reaching a sufficient vapor pressure to be able to control the precursor with a usual flow control device like a mass flow controller requires a temperature that such mass flow controllers may not withstand. Specifically in the case of solid precursors, which are typically in a powdery form, the heat conductivity from the walls of the heated solid precursor containing vessel into the bulk of the solid powder is very low comparing to liquid precursors. This means that the heat of evaporation, which tends to cool the solid in the vessel, may not be compensated by the heat flux from the solid precursor containing vessel. In practice, as undiluted vapors are pulled from the solid precursor containing vessel, the temperature of a solid bed drops, which in turn reduces the feed pressure down to a point where it may not meet the requirement to feed the mass flow controller. When a carrier gas is used, the effect may be strongly alleviated by the usage of a pre-heated carrier gas, and an improved thermal conductivity in the solid bed by using high thermal conductivity carrier gas like He. In the case of pure precursor vapors from liquids or liquefied gases, the problem is also less acute as buoyancy currents within the liquid in the precursor containing vessels are created from the density difference between the surface (cooled by evaporation) and the bottom (usually heated). Examples of technologies for high flow vaporization of liquefied gases may be found in US20080264072A1 for instance. More examples are as follows.

WO 2006/101767 to Marganski et al. discloses a system for delivery of reagents from solid sources, in which several types of canisters, method of canister heating, and delivery systems suitable for supplying solid precursors are included. The use of a buffer tank is written in claim 40, 49, 91-93, 199-201, molecules of $B_{18}H_{22}$, $B_{14}$hydride, and $XeF_2$ are in claims 254, 262 and 282.

U.S. Pat. No. 7,050,708 to Sandhu G. S. discloses delivery systems of solid chemical precursors. The canister temperature is controlled by connecting some components of the systems, such as MFC and/or pressure gauge connected to the deposition chamber, pressure sensor at inert gas lines at upstream of a precursor canister, and MFC for bleeding off the excess precursor vapors.

JP 2002-359238 to Yamamoto discloses a supply system for solid precursors and the method of vaporization of them. A precursor supply system containing some structures of heat conducting devices is disclosed. Regulation device of precursor flow was mentioned in the embodiment without detailed description.

U.S. Pat. No. 7,413,767 to Bauch et al, discloses a supply system for a CVD coating system with low volatility precursors, which contains an intermediate container to store precursor vapor and/or mixture gas at low temperature and low pressure compared to those of main precursor container. This enables a high volume precursor supply with low precursor temperature. A similar patent application publication is US20030145789.

As such it remains a challenge to feed a low pressure thin film deposition chamber with a pure vapor of a low volatility precursor, especially with a solid form of a precursor and/or in a remote delivery line.

SUMMARY

There is disclosed an embodiment of the invention that is a method for supplying a vapor of a precursor to a point of use, the method comprising the steps of a) evaporating the precursor in a first vessel to form a precursor vapor;

b) transferring the precursor vapor to a second vessel through a first gas conduit, wherein a pressure of the precursor vapor is reduced prior to the transfer to the second vessel to form a reduced pressure precursor vapor;

c) feeding the reduced pressure precursor vapor to the point of use from the second vessel through a second gas conduit wherein a flow rate of the reduced pressure precursor vapor to the point of use is at a pre-determined flow rate or flow rate range; and d) maintaining a partial pressure of the precursor in the second vessel at a pressure lower than the saturated vapor pressure of the precursor at the temperature of the second vessel and higher than an inlet pressure requirement of a flow control device that is controlling the flow rate of the reduced pressure precursor vapor to the point of use.

There is also disclosed embodiments wherein the steps of a) and b) further include a step of transferring the precursor vapor from the first vessel to the second vessel without adding a carrier gas, so that the precursor partial pressure in the first vessel and the second vessel are equal to the total pressure therein.

There is also disclosed embodiments wherein the flow control device is a MFC device.

There is also disclosed embodiments wherein the precursor is a volatile precursor with a vapor pressure at room temperature that is greater than the inlet pressure requirement of the flow control device.

There is also disclosed embodiments wherein the precursor is a low vapor pressure precursor, which has insufficient vapor pressure at room temperature to meet the inlet pressure requirement of the flow control device.

There is also disclosed embodiments wherein the low vapor pressure precursor is a solid precursor at room temperature.

There is also disclosed embodiments wherein the first vessel is heated to maintain a temperature higher than a melting point of a solid precursor.

There is also disclosed embodiments wherein the first vessel is heated and controlled to maintain a temperature so that a speed of vaporization of the precursor is higher than a speed of consumption of the precursor at the point of use.

There is also disclosed embodiments wherein the precursor vapor from the first vessel is effectively cooled down by traveling from the inlet located in the top of the second vessel to the outlet port located in the bottom of the second vessel so that the temperature of the precursor vapor reaches to an operation temperature of the point of use.

There is also disclosed embodiments wherein the minimum pressure of the inlet pressure requirement of the flow control device at the point of use is approximately between 0.1 and 50 kPa.

There is also disclosed embodiments wherein the minimum pressure of the inlet pressure requirement of the flow control device at the point of use is approximately between 1 and 10 kPa.

There is also disclosed embodiments wherein the minimum pressure of the inlet pressure requirement of the flow control device at the point of use is approximately between 5 and 10 kPa.

There is also disclosed embodiments wherein the precursor is selected from a metal or semi metal halide or oxyhalide, a metal carbonyl, adducts, or combinations thereof.

There is also disclosed embodiments wherein the precursor is selected from $WOCl_4$, $MoO_2Cl_2$, $WCl_6$, $WCl_5$, $MoCl_5$, $AlCl_3$, $AlBr_3$, $GaCl_3$, $GaBr_3$, $TiBr_4$, $TiI_4$, $SiI_4$, $GeCl_2$, $SbCl_3$, InCp, $MoOCl_4$, or the like.

There is also disclosed an embodiment of the invention that is a system for dispensing a vapor of a precursor to a point of use, the system comprising:

a) a first vessel containing the precursor and configured and adapted to heat the precursor to a temperature that results in a precursor vapor pressure of more than approximately 10 kPa therein;

b) a second vessel being configured and adapted to heat a precursor vapor therein to a temperature ranging from room temperature to a maximum temperature limitation of a flow control device fluidically connected thereto;

c) a first gas conduit fluidically connecting the first vessel to the second vessel, wherein a pressure reduction device and a pressure control device are fluidically connected to the first gas conduit;

d) a second gas conduit fluidically connecting the second vessel to a point of use, wherein a flow control device, configured and adapted to regulate a flow rate of the precursor vapor delivered to the point of use, is fluidically connected to the second vessel and the point of use; and e) a pressure gauge operably connected to the second vessel and adapted to measure a partial pressure of the precursor vapor in the second vessel, wherein the system is further configured and adapted to maintain the partial pressure of the precursor in the second vessel (i) at a pressure lower than a saturated vapor pressure of the precursor at a temperature of the second vessel and (ii) at a pressure higher than an inlet pressure requirement of the flow control device.

There is also disclosed the first vessel and the second vessel each are configured and adapted to be heated with a heating element connected to a thermal sensor configured and adapted to independently regulate the temperature of the first vessel and the second vessel, respectively.

There is also disclosed embodiments wherein the heating element is selected from a heating mantle, a liquid bath, a furnace, or a lamp.

There is also disclosed embodiments wherein the first vessel contains trays, fins, or rods between the heating element and the precursor configured and adapted to improve thermal conductivity therebetween.

There is also disclosed embodiments wherein an inner surface of the first and second vessels each are coated or have inserts to prevent a direct contact between the precursor and the inner surface of the first and second vessels, wherein the coatings or inserts are configured and adapted to protect the inner surface of the first and second vessels from corrosion and/or to protect the precursor from metallic contamination.

There is also disclosed embodiments wherein filters configured and adapted to filter the precursor vapor are provided to one or more of the first vessel, the second vessel, the first gas conduit and the second conduit.

There is also disclosed embodiments wherein the first and second gas conduits are configured and adapted to be heated to maintain a temperature higher than a local condensation temperature of the precursor vapor.

There is also disclosed embodiments wherein the system further comprises a scale or a liquid level sensor operably associated with the first vessel and configured and adapted to determine the amount of the precursor left in the first vessel.

There is also disclosed embodiments wherein the system is further configured and adapted to maintain the temperature of the first vessel to a temperature that maintains a pre-defined precursor vapor pressure with the first vessel based on the partial pressure of the precursor in the first vessel.

There is also disclosed embodiments wherein the pressure reduction device is selected from an orifice, a needle valve, a capillary tube, or a valve, configured and adapted to be capable of isolating the first vessel from the second vessel.

There is also disclosed embodiments wherein the pressure reduction device is a needle valve.

There is also disclosed embodiments wherein the pressure control device is a pneumatic valve or an automated valve controlled by a control mechanism.

There is also disclosed embodiments wherein the control mechanism is a programmable logic controller (PLC).

There is also disclosed embodiments wherein the pressure control device is a pneumatic valve.

There is also disclosed embodiments wherein the pressure control device is an automated valve controlled by a control mechanism.

There is also disclosed embodiments wherein the pressure control device is an automated valve controlled by a PLC.

There is also disclosed embodiments wherein the second vessel contains a dip tube that connects to an inlet in the top wall of the second vessel and reaches to slightly above the bottom wall of the second vessel inside the second vessel.

There is also disclosed embodiments wherein the second vessel contains a dip tube that connects to an outlet port in the top wall of the second vessel and reaches to slightly above the bottom wall of the second vessel inside the second vessel.

There is also disclosed embodiments wherein the second vessel contains two dip tubes, wherein one dip tube connects to an inlet in top wall of the second vessel and reaches to slightly above the bottom wall of the second vessel, and the other dip tube connects to an outlet port in the bottom wall of the second vessel and reaches to slightly below the top wall of the second vessel inside the second vessel.

There is also embodiments wherein disclosed an inlet located in the top wall of the second vessel and an outlet port located in the bottom wall of the second vessel.

There is also disclosed embodiments wherein an inlet and an outlet port of the second vessel are located in different walls of the second vessel.

There is also disclosed embodiments wherein an inlet and an outlet port of the second vessel are located in the opposite walls of the second vessel.

There is also disclosed embodiments wherein there are no dip tubes in the second vessel when there is an inlet located in the top wall of the second vessel and an outlet port located in the bottom wall of the second vessel.

There is also disclosed embodiments wherein there are no dip tubes in the second vessel when an inlet and an outlet port of the second vessel are located in the opposite walls of the second vessel.

There is also disclosed embodiments wherein the precursor vapor from the first vessel is effectively cooled down by passing through the dip tubes so that the temperature of the precursor vapor reaches to an operation temperature of the point of use.

There is also disclosed embodiments wherein the precursor vapor from the first vessel is effectively cooled down by traveling from the inlet in the top wall to the outlet in the bottom wall of the second vessel so that the temperature of the precursor vapor reaches to an operation temperature of the point of use.

There is also disclosed embodiments wherein the system further comprises a carrier gas delivery subsystem configured and adapted to provide a carrier gas to the system to dilute the precursor vapor downstream from the first vessel.

Notation and Nomenclature

The following detailed description and claims utilize a number of abbreviations, symbols, and terms, which are generally well known in the art, and include;

As used herein, the indefinite article “a” or “an” should generally be construed to mean “one or more” unless specified otherwise or clear from context to be directed to a singular form.

As used herein, “about” or “around” or “approximately” in the text or in a claim means±10% of the value stated.

As used herein, “room temperature” in the text or in a claim means from approximately 20° C. to approximately 25° C.

As used herein, “close to” or “nearly” in the text or in a claim means within 10% of the term stated. For example, “close to saturated concentration” refers to within 10% of saturated concentration.

The standard abbreviations of the elements from the periodic table of elements are used herein. It should be understood that elements may be referred to by these abbreviation (e.g., Si refers to silicon, In refers to indium, N refers to nitrogen, O refers to oxygen, C refers to carbon, H refers to hydrogen, F refers to fluorine, etc.).

The unique CAS registry numbers (i.e., “CAS”) assigned by the Chemical Abstract Service are provided to identify the specific molecules disclosed.

Reference herein to “one embodiment” or “an embodiment” means that a particular feature, structure, or characteristic described in connection with the embodiment may be included in at least one embodiment of the invention. The appearances of the phrase “in one embodiment” in various places in the specification are not necessarily all referring to the same embodiment, nor are separate or alternative embodiments necessarily mutually exclusive of other embodiments. The same applies to the term “implementation.”

“Comprising” in a claim is an open transitional term which means the subsequently identified claim elements are a nonexclusive listing i.e. anything else may be additionally included and remain within the scope of “comprising.” “Comprising” is defined herein as necessarily encompassing the more limited transitional terms “consisting essentially of” and “consisting of”; “comprising” may therefore be replaced by “consisting essentially of” or “consisting of” and remain within the expressly defined scope of “comprising”.

“Providing” in a claim is defined to mean furnishing, supplying, making available, or preparing something. The step may be performed by any actor in the absence of express language in the claim to the contrary.

Ranges may be expressed herein as from about one particular value, and/or to about another particular value. When such a range is expressed, it is to be understood that another embodiment is from the one particular value and/or to the other particular value, along with all combinations within said range. Any and all ranges recited herein are inclusive of their endpoints (i.e., x=1 to 4 or x ranges from 1 to 4 includes x=1, x=4, and x=any number in between), irrespective of whether the term "inclusively" is used.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations, That is, if X employs A; X employs B; or X employs both A and B, then "X employs A or B" is satisfied under any of the foregoing instances.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1A:
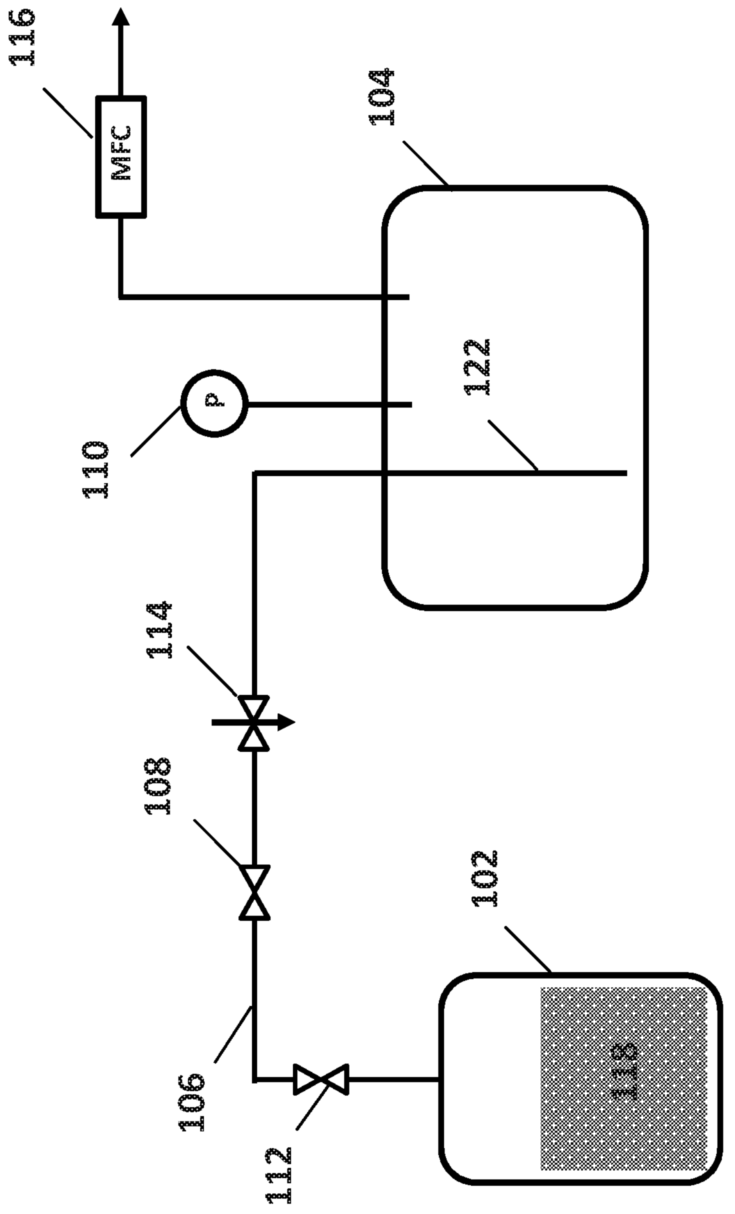
FIG. 1*a* is a schematic block diagram of a first exemplary embodiment of the disclosed supply system for low volatility precursors.

Disclosed are supply systems suitable for supplying precursors without using carrier gases for the manufacturing of semiconductors, photovoltaic cells, flat panel displays, and in general for any deposition processes under reduced pressure, such as, powder coating, 3D object coatings, etc. More specifically, disclosed are the supply system suitable for supplying low volatility precursors without using the carrier gases, such as low volatility liquid or liquefied precursors or solid precursors. The disclosure also include methods for using the disclosed supply system.

The disclosed supply systems decouple a vapor flow limitation from a maximum operating temperature of a flow control device fluidically connected to a point of application. The disclosed supply systems include a high temperature (HT) precursor-containing vessel or a HT precursor storage vessel and a low temperature (LT) buffer vessel. The LT buffer vessel is fluidically connected to the HT precursor-containing vessel. The disclosed supply system controls a pressure in the LT buffer vessel to maintain the pressure within a predetermined pressure range. Furthermore, the disclosed supply systems may use the HT precursor-containing vessel at a temperature above the melting point (MP) of the precursor, even if such MP is much higher than the maximum operating temperature of the downstream a flow control device. Specifically, the disclosed supply systems use the HT precursor-containing vessel at a temperature that results in a precursor pressure of more than approximately 10 kPa therein. Here, the HT precursor-containing vessel may be heated to maintain a temperature higher than a melting point of the precursor. In addition, the HT precursor-containing vessel may be heated and controlled to maintain a temperature so that a speed of vaporization of the precursor is higher than a speed of consumption of the precursor at the point of use.

It is known that there is a limitation of the precursor vapor flux from a precursor storage vessel that feeds to a film deposition process chamber(s). Such limitation is caused by the operating temperature limit of the flow control device that prevents the usage of very high temperature evaporation vessels and vapors. It is however important to supply a sufficient heat flux into the precursor storage vessel to compensate for the heat of evaporation of the precursor material and thereby allow a stable flow and precursor vapor pressure. The disclosed supply systems decouple the ability of the precursor storage vessel to evaporate the precursor at a sufficient flow rate and the ability to feed the flow control device with the vapor at a temperature below the maximum operating temperature of the flow control device, while maintaining a sufficient feed pressure to the flow control device to accurately control the precursor vapor flow rate.

In the disclosed supply systems, the precursor-containing vessel is at a temperature high enough to vaporize the average required flow to the process chamber(s) or other point of use. Since a vapor flux is limited by a heat flux to the precursor, and the heat flux is limited by a temperature gradient between the precursor storage vessel and the precursor inside, increasing the temperature of the precursor storage vessel increases the maximum vapor flux from the precursor storage vessel. In practice, the required temperature of the precursor storage vessel is higher than the maximum operating temperature of the flow control device, for example, a flow control device made by Hitachi Metals has the maximum operating temperature around 150° C. Different flow control devices have different maximum operating temperatures. Next, the precursor vapor flows from the high temperature precursor storage vessel to the LT buffer vessel through a pressure reduction device, so as to maintain the pressure in the LT buffer vessel at a pressure lower than the saturated vapor pressure of the precursor at a temperature of the LT buffer vessel. As such, the precursor remains in the gas phase without condensation in the LT buffer vessel. The LT buffer vessel temperature, and thus the precursor vapor temperature inside the buffer vessel, may be selected to be lower than the maximum operating temperature of the flow control device on the gas conduit that feeds the process chamber(s) or other points of use. Furthermore, feeding the precursor vapor from the HT precursor storage vessel to the LT buffer vessel is based on the partial precursor vapor pressure within the LT buffer vessel.

FIG. 1*a* is a schematic block diagram of an exemplary embodiment of the disclosed supply system for low volatility precursors. In this embodiment, the disclosed supply system 100 includes a precursor storage vessel, also defined as a high temperature (HT) vessel 102, which fluidically connected to a buffer tank (the second vessel), also defined as a low temperature (LT) buffer 104 through a first gas conduit 106. A precursor 118 is contained in the HT vessel 102. The precursor 118 may be a volatility precursor. The precursor 118 may be a low volatility precursor, such as a solid precursor or a liquid or liquefied (e.g., melted) precursor. The vapor of the precursor 118 is fed to the LT buffer 104. The gas conduit 106 is fluidically equipped with a pressure control device 108 to control the flow of the vapor from the HT vessel 102 to the LT buffer 104 by reducing the pressure of the vapor. The pressure control device 108 may be a pneumatic valve or an automated valve controlled by a control mechanism (not shown), such as a programmable logic controller (PLC). The gas conduit 106 is also fluidically equipped with an isolation valve 112 to turn on and off the HT vessel 102 and a pressure reduction device 114 to control the flow rate of the vapor of the precursor 118. The pressure reduction device 114 is a flow regulating device herein. The pressure reduction device 114 may be a needle valve, a calibrated orifice, a capillary tube, a pressure regulator, or any devices acting as a flow restriction that is compatible with the temperature of the HT vessel 102. At least one pressure gauge 110 is fluidically installed in the LT buffer 104 and capable of measuring the pressure in the LT buffer 104. The HT vessel 102, LT buffer 104 and gas conduit 106 each are set at a required temperature setpoint. The temperature of the HT vessel 102 and the temperature of the LT buffer 104 may be independently regulated. The temperature of the HT vessel 102 may be set in a range between room temperature and about 300° C., preferably between room temperature and about 250° C., depending on the vaporization capability of the precursor. The temperature of the LT buffer 104 may be set to be lower than the maximum operating temperature of a flow control device 116 downstream the LT buffer 104. The flow control device 116 may be a mass flow control (MFC) device or the like. If the maximum operating temperature of a flow control device 116 is about approximately 150° C., the temperature of the LT buffer 104 may be set to a range between room temperature and about 150° C.

Figure 1B:
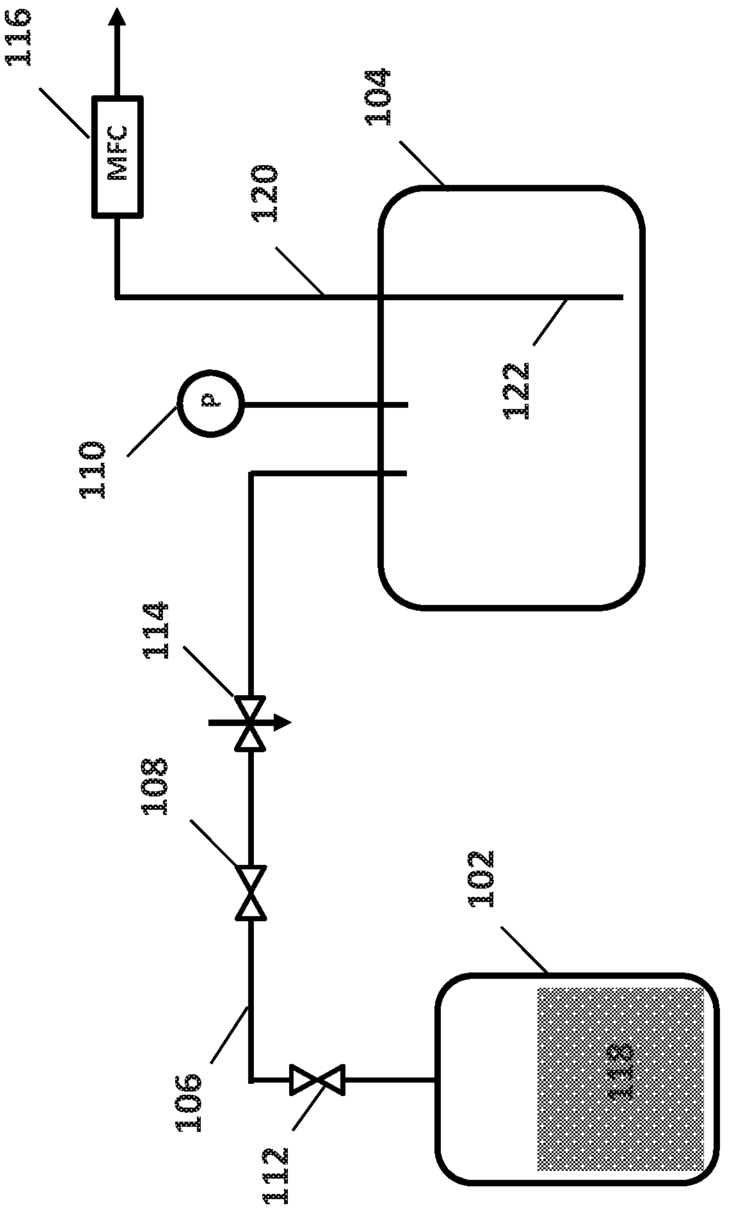
FIG. 1*b* is another schematic block diagram of a first exemplary embodiment of the disclosed supply system for low volatility precursors.
Figure 1C:
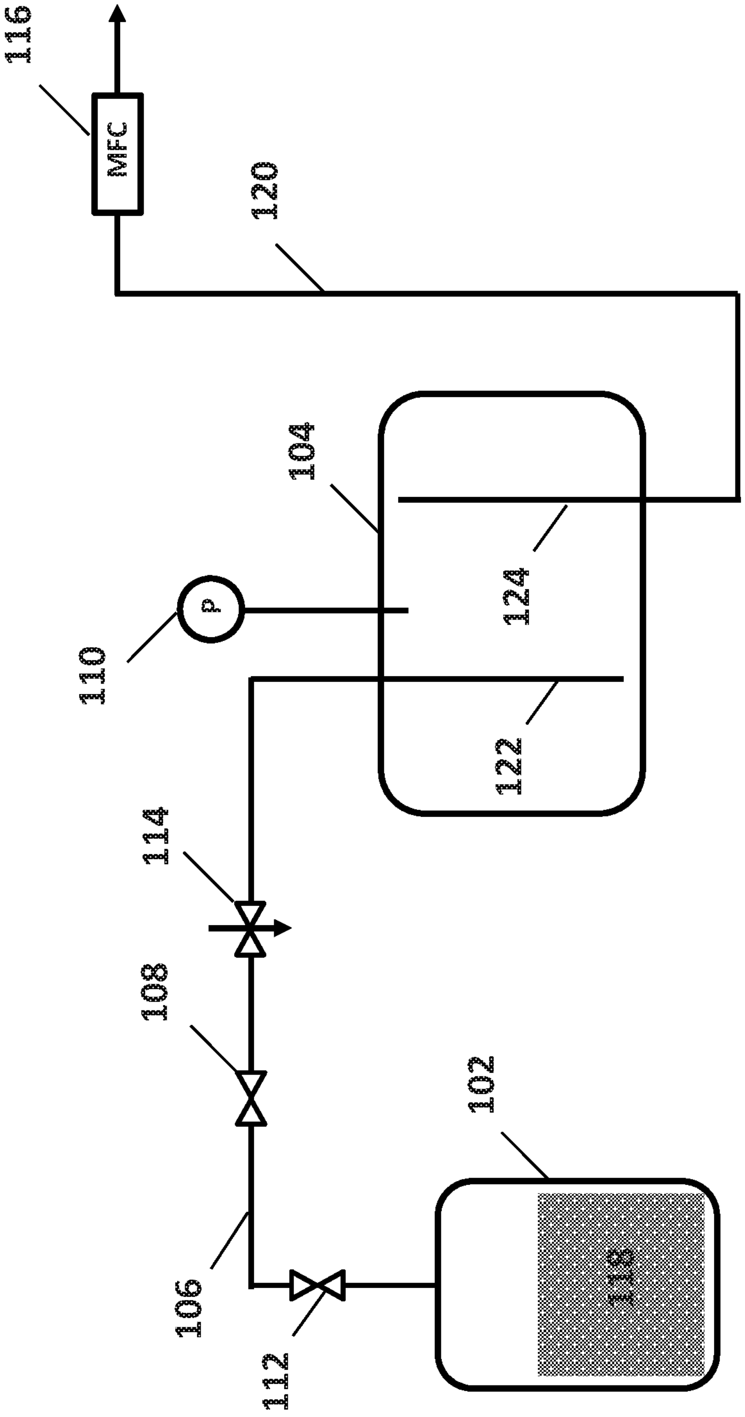
FIG. 1*c* is another schematic block diagram of a first exemplary embodiment of the disclosed supply system for low volatility precursors.

The LT buffer 104 contains a dip tube 122, which connects to an inlet or an inlet port in the top wall of the LT buffer 104, and reaches to slightly above the bottom wall of the LT buffer 104 in the LT buffer 104. In an alternative embodiment, the dip tube 122 may connect to an outlet or an outlet port in the top wall of the LT buffer 104, and reach to slightly above the bottom of the LT buffer 104 in the LT buffer 104, as shown in FIG. 1*b*. The difference between FIG. 1*a* and FIG. 1*b* is the location of the dip tube 122. In another alternative embodiment as shown in FIG. 1*c*, the disclosed supply system may include two dip tubes 122 and 124. One dip tube 122 connects to an inlet in the top wall of the LT buffer 104 and reaches to slightly above the bottom wall of the LT buffer 104 in the LT buffer 104 and the other dip tube 124 connects to the outlet in the bottom wall of the LT buffer 104 and reaches to slightly below the top wall of the LT buffer 104 in the LT buffer 104. The difference between FIG. 1*a* and FIG. 1*c* is, in FIG. 1*c*, the inlet is located in the top wall of the LT buffer 104 and the outlet ports is located in the bottom wall of the LT buffer 104 and one more dip tube 124 is connected to the outlet in the bottom wall of the LT buffer 104 and reached slightly below to the top wall of the LT buffer 104 in the LT buffer 104, and vise versa.

By adding one or more dip tubes, a hot precursor vapor from the HT vessel 102 is effectively cooled down by passing through the dip tubes so that the temperature of the precursor vapor reaches to an operation temperature of the flow control devices 116 or the point of use.

Figure 1D:
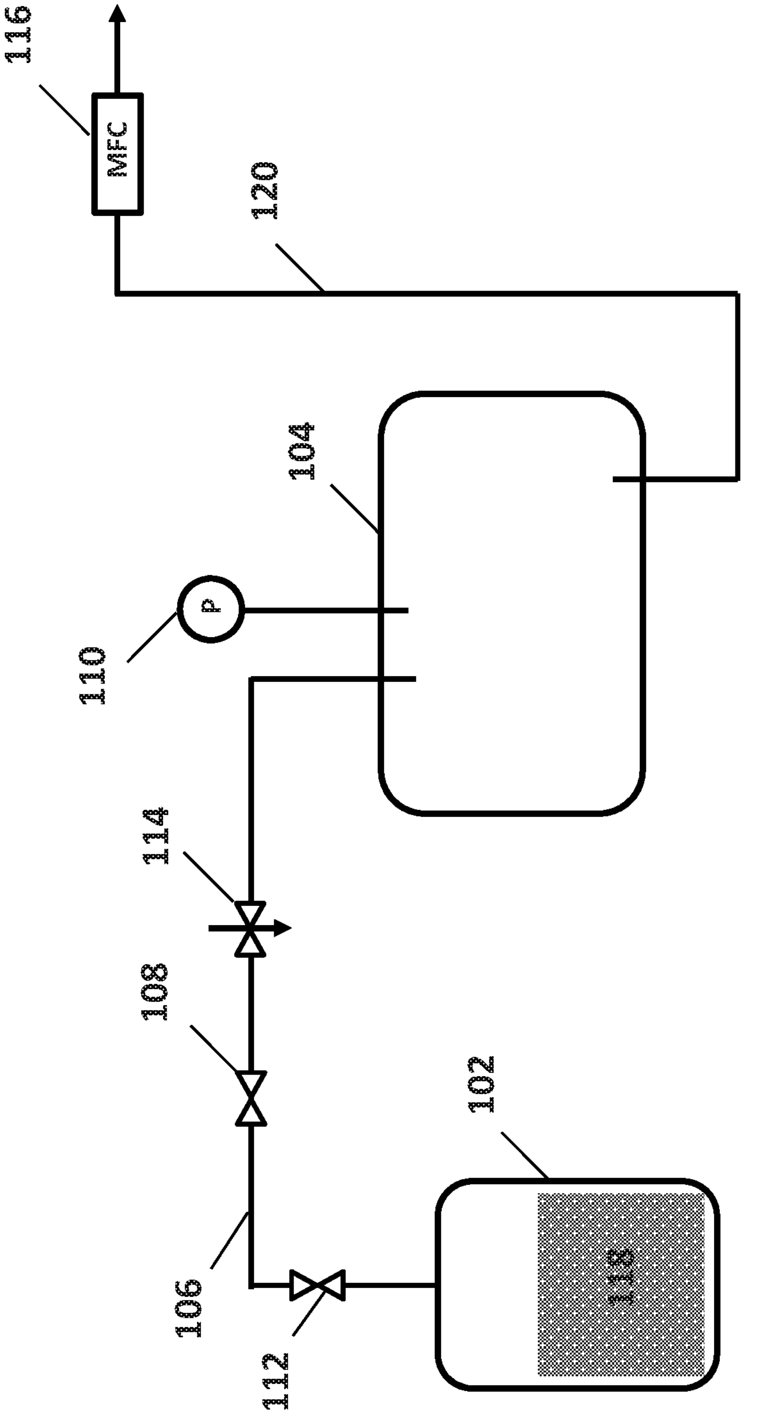
FIG. 1*d* is another schematic block diagram of a first exemplary embodiment of the disclosed supply system for low volatility precursors.

In another alternative embodiment as shown in FIG. 1*d*, the inlet and the outlet of the LT buffer 104 are located in the top wall and bottom wall of the LT buffer 104, respectively, and no dip tubes are installed. Since the inlet and the outlet ports are in different sides of the walls, a hot precursor vapor from the HT vessel 102 is effectively cooled down by travelling from the inlet to the outlet port in the different sides so that the temperature of the precursor vapor reaches to an operation temperature of the flow control devices 116 or the point of use. The difference between FIG. 1*a* and FIG. 1*d* is the inlet and the outlet ports of the LT buffer 104 are in different sides and no dip tubes in FIG. 1*d*.

Here, referring to the embodiments shown in FIG. 1*a* to FIG. 1*d*, at least one isolation valve 112 is installed in the HT vessel 102 for pressure control. The isolation valve 112 may be an automated or manually operated valve. The automatically operated isolation valve 112 is controlled by a control mechanism (not shown), such as a PLC. Other valves or valves manifold may be added for purging the connection point of the HT vessel 102 to the gas conduit 106 or for servicing the vessel (e.g., filling, cleaning). The HT vessel 102 is typically made of a high temperature compatible material such as stainless steel, inconel, hastelloy, nickel, etc., and preferably from stainless steel. The HT vessel 102 may contain elements to enhance the heat transfer from the vessel 102 to the precursor material 118, such as high heat conductivity rods, trays, beads, fins that increase the contact surface to the precursor material 118. The HT vessel 102 may be heated to maintain a temperature that is higher than the melting point of a solid precursor stored therein or at a temperature that results in a precursor vapor pressure is more than approximately 10 kPa therein. The HT vessel 102 may be heated and controlled to maintain a temperature so that a speed of vaporization of the precursor is higher than a speed of consumption of the precursor at the point of use. The HT vessel 102 may be equipped with a pressure gauge and/or an embedded load cell to measure the vessel pressure or the vessel total weight when the HT vessel 102 is installed in the supply system. The HT vessel 102 may be provided with surface protection to prevent surface corrosion and precursor contamination from the metallic surface of the HT vessel 102, such as CVD deposited coatings, ALD deposited coatings, liners or inserts. Such coatings or components would be selected based on their inertness to the precursor at elevated temperature, for instance but not limited to SiC, $Al_2O_3$, $Ta_2O_5$, $Y_2O_3$, AlN, etc.

The HT vessel 102 may be provided with a pressure gauge or the like to measure the precursor partial pressure in the HT vessel 102 and adjust the temperature of the HT vessel 102 to maintain the precursor partial pressure at a predefined set point. The evaporation in the HT vessel 102 may be carried out without adding a carrier gas, so that the precursor partial pressure in the HT vessel 102 is equal to the total pressure of the HT vessel 102.

The HT vessel 102 may be provided with a liquid level sensor, such as a float, a radar, an ultrasonic, or a scale to determine the amount of the precursor left in the HT vessel 102.

The precursor evaporation in the HT vessel 102 may be carried out with a carrier gas, such as, an inert gas $N_2$ or Ar. In this case, a measurement of the precursor concentration may be carried out anywhere downstream the HT vessel 102. The measurement may be an FTIR, an NIR, a Mass spectrometer, a thermal conductivity detector, an ultrasonic detector, or the like.

In case of a higher volatility precursor being used, an additional carrier gas may be introduced to dilute the precursor vapor downstream the HT vessel 102.

The gas conduit 106, the HT vessel 102 and the LT buffer 104 are provided with the pressure control device 108, also defined as an isolation device, having the capability to isolate the vessels such as a pneumatic valve, with the pressure reduction device 114. The pressure reduction device 114 and the pressure control device 108 may be combined in the same assembly, for instance an orifice inserted in a stop valve. The pressure control device 108 and the pressure reduction device 114 may be mounted in any order, such as downstream or upstream of each other. The gas conduit 106 may be equipped with other valves (not shown) and conduits to enable to purge the gas conduit 106 for maintenance purposes, or to vent the precursor vapor outside the HT vessel 102, for example, for precursor conditioning and stabilization. The gas conduit 106 should be heated to a temperature at least equal to the temperature of the HT vessel 102 upstream the pressure reduction device 114, and at least equal to the temperature of the LT buffer 104 downstream the pressure reduction device 114. Additional heating and/or higher temperature may be required at immediately downstream of the pressure reduction device 114 to compensate for the vapor cooling owing to the vapor expansion in the pressure reduction device 114 due to Joule Thompson effect. The gas conduit 106 may also be equipped with flow or pressure sensors (not shown).

The LT buffer 104 is also connected via a gas conduit 120 to the flow control device 116, to the deposition process chamber(s) (not shown) or other points of use. The flow control device 116 may be part of the supply system or part of the deposition process chamber(s) or other point of use equipment. The pressure in the LT buffer 104 may be maintained at a pressure that is higher than an inlet pressure requirement of the flow control device 116 at a point of use, in which case the maintained pressure may be approximately 0.1 kPa at minimum. The pressure of the inlet pressure requirement of the flow control device 116 at the point of use is in a range between approximately 0.1 and approximately 50 kPa, preferably between approximately 1 and approximately 10 kPa, more preferably between approximately 5 and approximately 10 kPa. In this case, the point of use may be the deposition process chamber(s). The LT buffer 104 is typically made of a chemically compatible material such as stainless steel, Inconel, hastelloy, nickel, etc., and preferably from stainless steel. The pressure of the precursor vapor in the LT buffer 104 may be measured directly or indirectly. Alternatively, a pressure gauge 110 measuring the pressure of the precursor vapor in the LT buffer 104 may be mounted on the gas conduit 106. The LT buffer 104 may also have surface protection (not shown) to prevent corrosion and precursor contamination from the metallic surface such as CVD deposited coatings, ALD deposited coatings, liners or inserts. Such coatings or components may be selected based on their inertness to the precursor at elevated temperature, which may include for instance but are not limited to SiC, $Al_2O_3$, $Ta_2O_5$, $Y_2O_3$, AlN, etc.

The HT vessel 102, LT buffer 104, gas conduit 106 and gas conduit 120 each may be heated. The heating element may include, but are not limited to, heating mantles, heating tape, heating inserts, or may be enclosed in a heated furnace, provided that at least the temperature of the HT vessel 102 and the LT buffer 104 each are controlled independently. The gas conduits 106 and 120 are heat traced at a temperature higher than the local condensation temperature of the precursor.

The HT Vessel 102, LT buffer 104 and gas conduits 106 and 120 each may be provided with filters.

Figure 2:
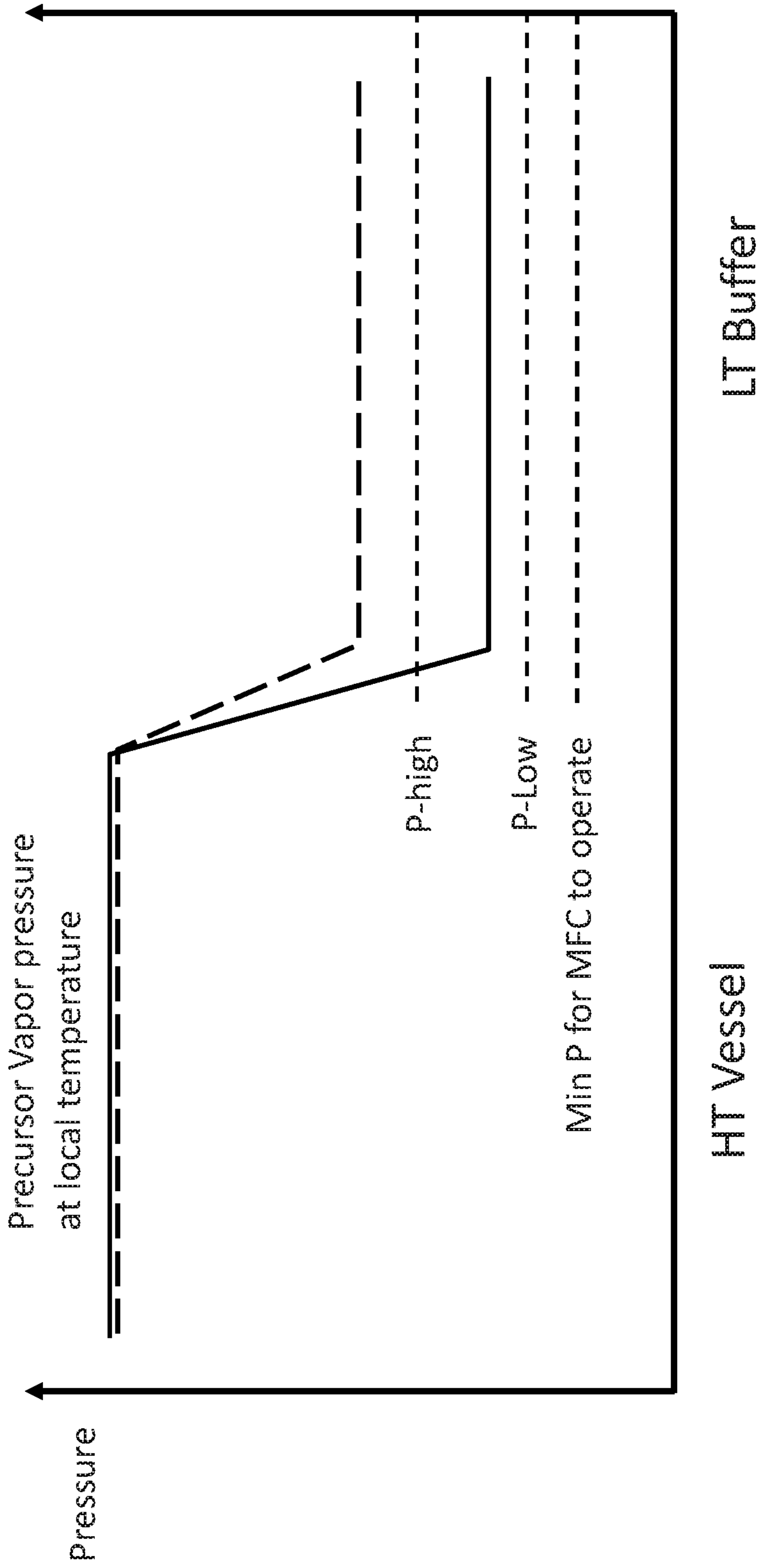
FIG. 2 is a diagram demonstrated the pressures in the HT first vessel and the LT buffer second vessel in the disclosed supply system, respectively.

Throughout the embodiments shown in FIG. 1*a* to FIG. 1*d*, a control mechanism is also included, but not shown. The control mechanism may be a PLC that integrate, control and monitor pressure gauges, temperature sensors, various valves, heating elements, liquid level sensors, scale, filters, etc. The control mechanism may set the HT vessel 102 and the LT buffer 104 in communication when the pressure in the LT buffer 104 is lower than a predetermined pressure set point, such as P-low, as shown in FIG. 2. The control mechanism may close the LT vessel 104 when the LT buffer 104 reaches a setpoint P-high through operating the pressure control device 108. Here, P-law and P-high are defined so that:

- P-low is higher than the minimum pressure required for the flow control device 116 to operate at a required flow rate for a point of use such as a material deposition process (e.g. CVD, ALD, etc.);
- P-high is lower than the saturated vapor pressure of the precursor at the temperature of the LT buffer 104 to avoid condensation;
- P-high is also lower than the maximum feed inlet pressure of the flow control device 116.

FIG. 2 is a diagram demonstrated the pressures in the HT vessel and the LT buffer in the disclosed supply systems referring to FIG. 1*a* to FIG. 1*d*, respectively. As shown, the precursor vapor pressure at a local temperature in the HT vessel is higher than the pressure in the LT buffer and the precursor vapor pressure at local temperature in the HT vessel is much higher than the minimum pressure for the flow control device to operate. In operation, the pressure of the LT buffer is maintained between P-low and P-high. In this way, the precursor vapor flow limitation may be decoupled from the max operating temperature of a flow control device.

The disclosed supply systems may apply to a variety of precursors that are liquid or solid at room temperature, organic or inorganic. In a preferred embodiment, the precursor material 118 may be solid at room temperature. The melting point of the solid precursor may be from room temperature to about 300° C. Examples of such precursors are metal or semi-metal halides or oxyhalide, a metal carbonyl, or adducts thereof, such as $WOCl_4$, $MoO_2Cl_2$, $WCl_6$, $WCl_5$, $WBr_5$, $ZrCl_4$, $HfCl_4$, $TiF_4$, Silo, $TiBr_4$, $TiI_4$, $MoCl_5$, $MoBr_5$, $GeCl_2$:adduct, $AlCl_3$, $AlBr_3$, $GaCl_3$, $GaBr_3$, $GeCl_2$, $SbCl_3$, $InCl_3$, Ina, metal oxyhalides, such as $WOCl_4$, $MoOCl_4$, $MoO_2Cl_2$, organometallic precursors, such as but not limited to $W(CO)_6$, $Mo(CO)_6$, $M(RxCp)_3$ (M=rare earth, R=H, $C_1$-$C_{10}$ alkyl, trialkysilyl), In(RCp), $M(RCp)_2X_2$ (M=Group IV metal, X=halide), or other derivatives based on various ligands such as alkyl, alkoxy, alkylamino, beta-diketonate, amidinate, carbonyls, cyclopentadienyls and halides, whether homoleptic or heteroleptic. In a preferred embodiment, the melting point of the precursor is selected to be lower than the temperature of the HT vessel 102 and higher than the temperature of the LT buffer 104.

In summary, the disclosed supply systems have the following advantages. The disclosed supply systems decouple the flow limitation from the maximum operating temperature of a flow control device. The disclosed supply systems control the pressure in a buffer vessel to maintain the pressure between a predetermined pressure range, i.e., between P-high and P-low as defined. The disclosed supply systems have the possibility to use a HT vessel at a temperature larger than the melting point (MP) of the precursor, even if such MP is much larger than the maximum operating temperature of the flow control device.

EXAMPLES

The following non-limiting examples are provided to further illustrate embodiments of the invention. However, the examples are not intended to be all inclusive and are not intended to limit the scope of the inventions described herein.

Example 1

Referring to FIG. 1*a* to FIG. 1*d*, Molybdenum(VI) dichloride dioxide ($MoO_2Cl_2$, CAS No.: 13637-68-8) was stored in a HT vessel 102 heated to 185° C. $MoO_2Cl_2$ gas is introduced into the LT Buffer 104, at a temperature of 150° C., after pass through the pressure reduction device 114 (e.g., a needle valve). A pressure of the LT buffer 104 was maintained between 25 to 30 kPa by using the pressure control device 108 (e.g., an automated valve) controlled by a control mechanism (not shown), such as a PLC. 1 L/min (i.e., 1000 sccm) of $MoO_2Cl_2$ gas flow is controlled to film deposition chamber(s) (not shown) by using single MFC 116 which has a max operation temperature at 150° C.

Example 2

Figure 3A:
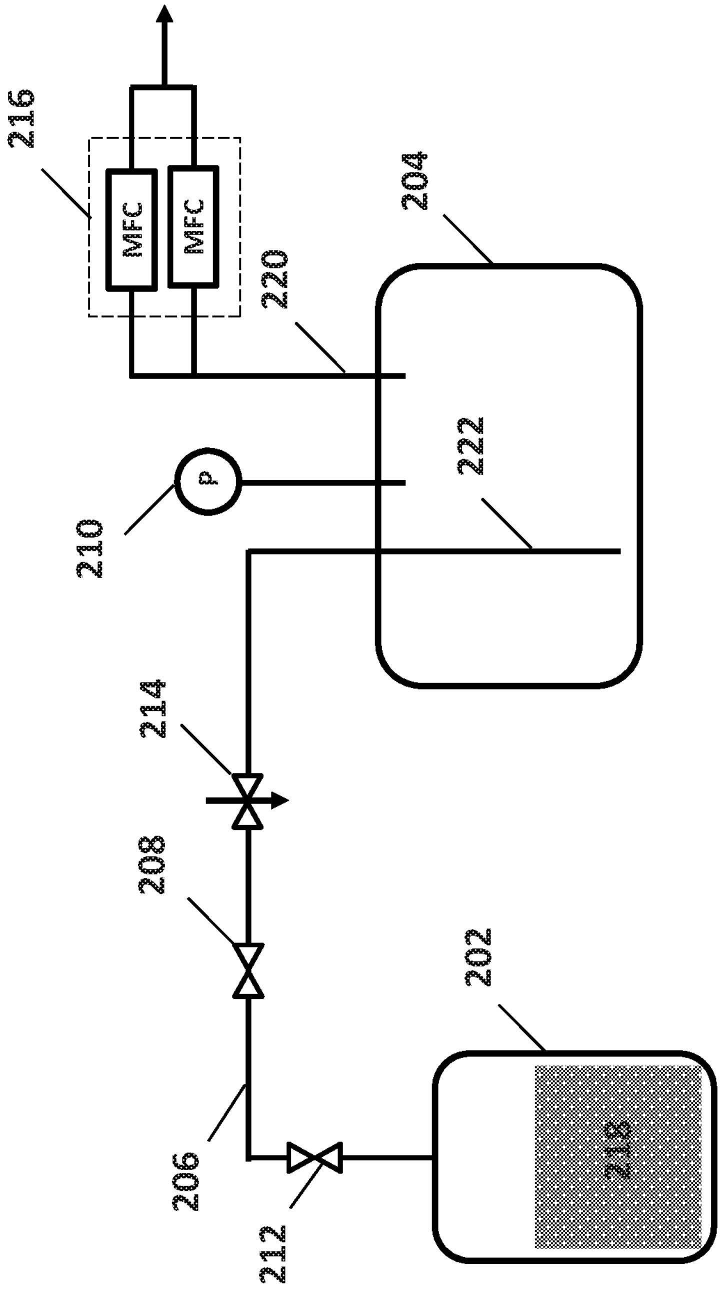
FIG. 3*a* is a schematic block diagram of a second exemplary embodiment of the disclosed supply system for low volatility precursors.
Figure 3B:
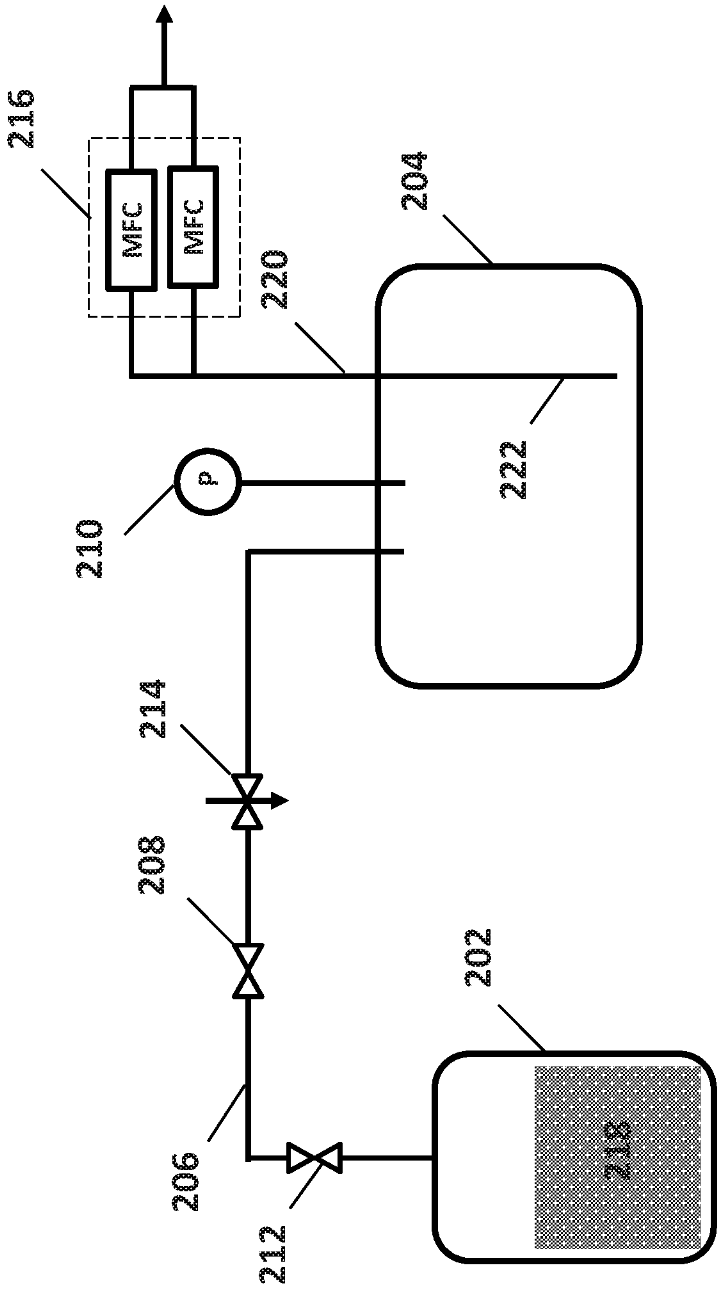
FIG. 3*b* is another schematic block diagram of a second exemplary embodiment of the disclosed supply system for low volatility precursors.
Figure 3C:
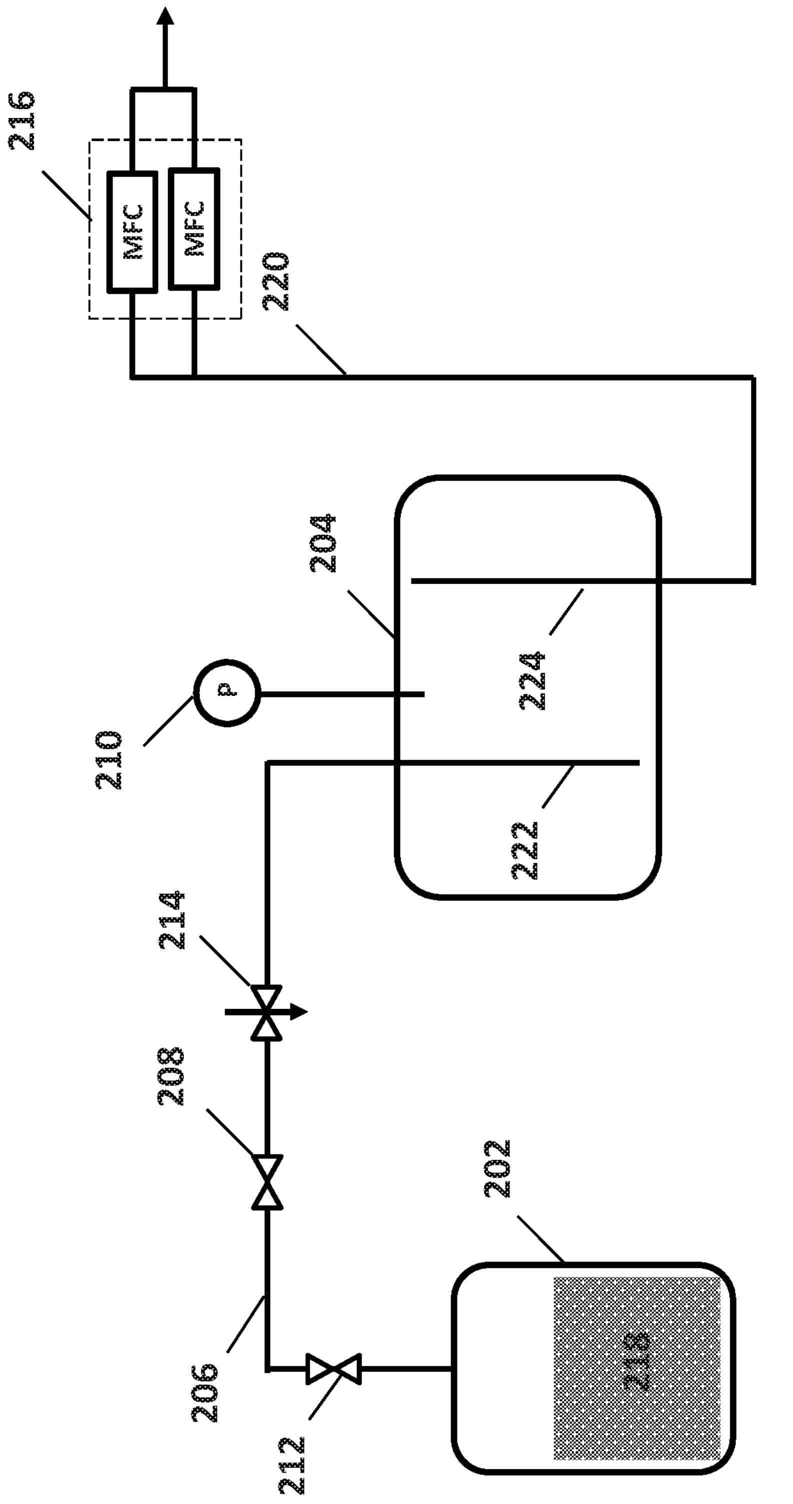
FIG. 3*c* is another schematic block diagram of a second exemplary embodiment of the disclosed supply system for low volatility precursors.
Figure 3D:
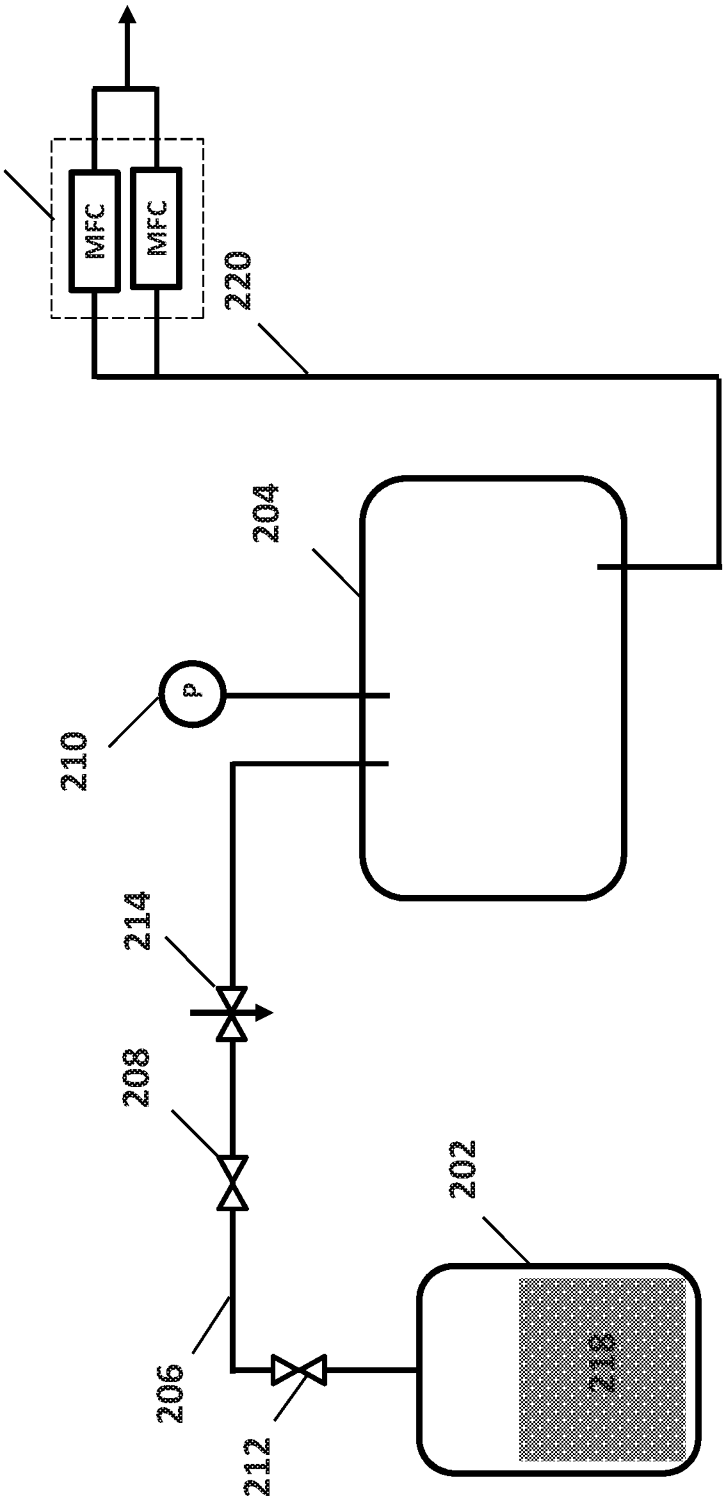
FIG. 3*d* is another schematic block diagram of a second exemplary embodiment of the disclosed supply system for low volatility precursors.
Figure 5:
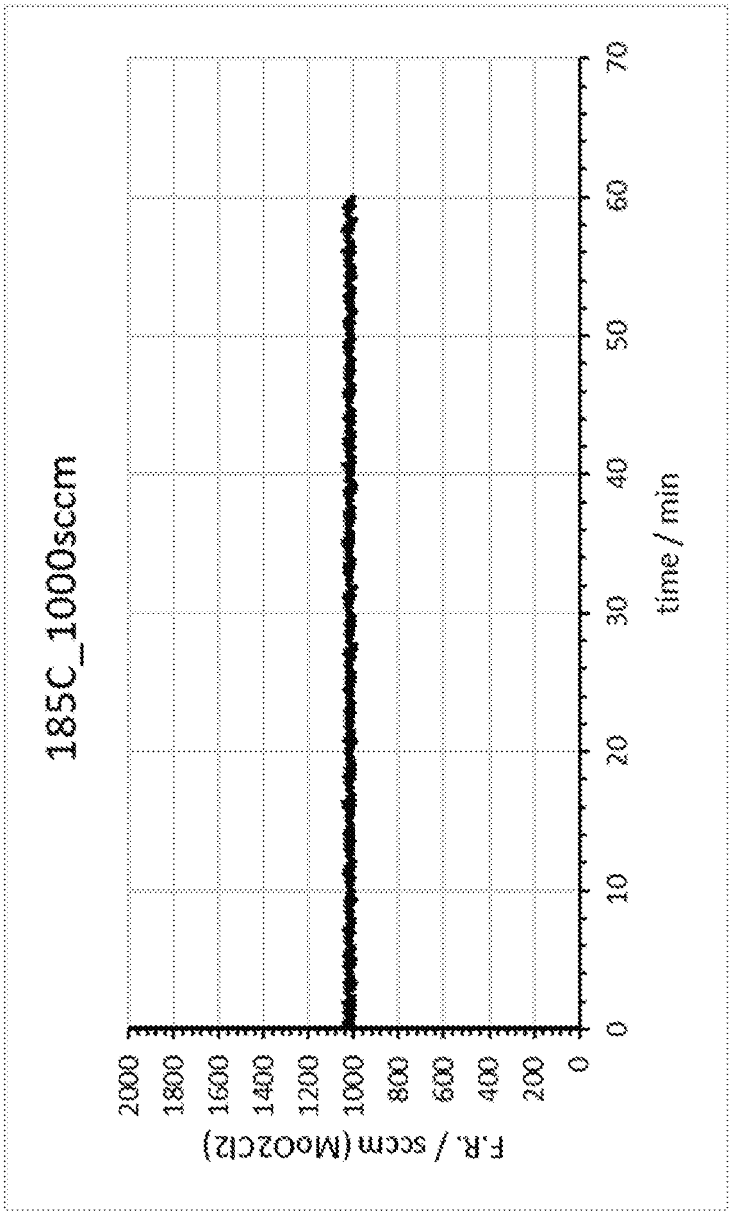
FIG. 5 is a diagram of time dependence of flow rate of the vapor of the precursor at 185° C. and flow rate of 1000 sccm.

Referring to FIG. 3*a* to FIG. 3*d*, $MoO_2Cl_2$ was stored in the HT vessel 202 heated at 185° C. $MoO_2Cl_2$ gas is introduced into the LT buffer 204 at a temperature of 150° C., after pass through the pressure reduction device 214 (e.g., a needle valve). Similar to FIG. 1*a*, FIG. 3*a* has alternative embodiments as shown in FIG. 3*b* to FIG. 3*d* corresponding to FIG. 1*b* to FIG. 1*d* with various dip tube setups or without dip tubes. The difference between FIG. 1*a* to FIG. 1*d* and FIG. 3*a* to FIG. 3*d* is FIG. 3*a* to FIG. 3*d* each have two parallel connected MFCs 216. The pressure of the LT buffer 204 was maintained between 15 to 20 kPa by using the pressure control device 208 (e.g., an automated valve) connected to a control mechanism (not shown), such as a PLC. 1 L/min of $MoO_2Cl_2$ gas flow is controlled to film deposition chamber(s) (not shown) by using two parallel connected MFCs 216 which have a max operation temperature at 150° C. FIG. 5 is a diagram of time dependence of flow rate of the vapor of the precursor at 185° C.

Example 3

Figure 6:
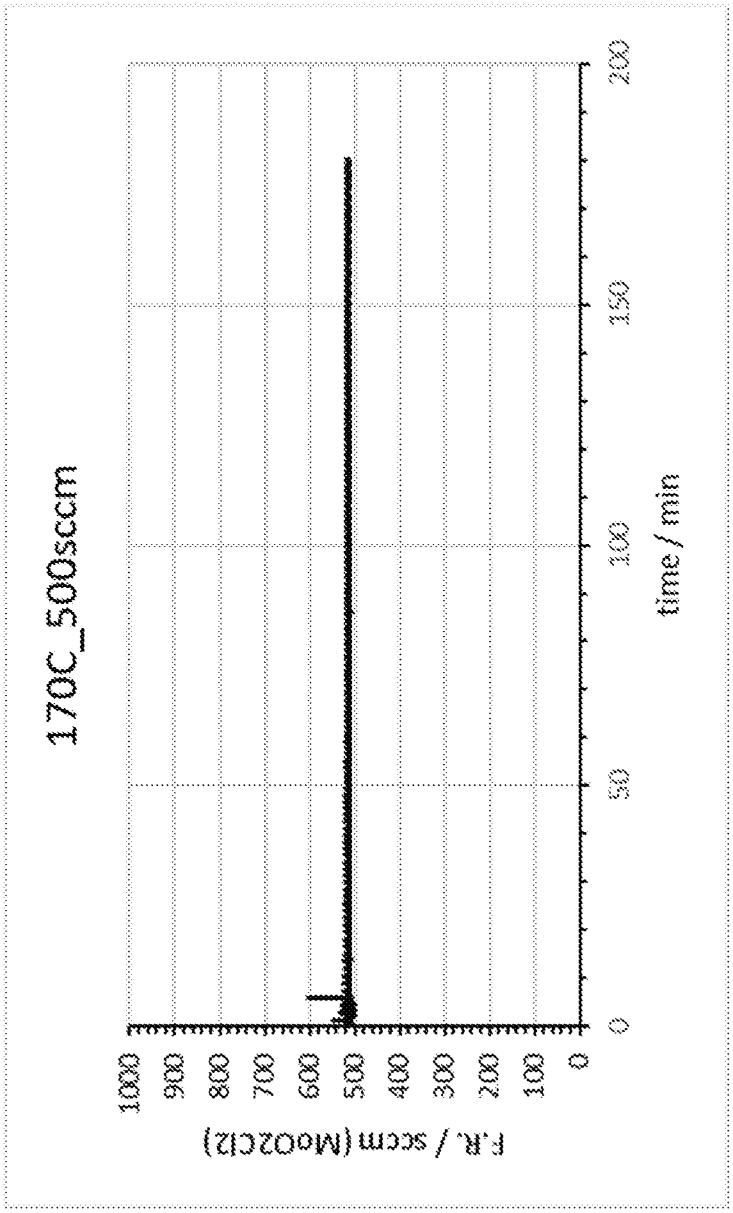
FIG. 6 is a diagram of time dependence of flow rate of the vapor of the precursor at 170° C. and flow rate of 500 sccm.

Referring to FIG. 1*a* to FIG. 1*d*, $MoO_2Cl_2$ was stored in the HT vessel 102 heated at 170° C. $MoO_2Cl_2$ gas is introduced into the LT buffer 104 at a temperature of 150° C., after pass through the pressure reduction device 114 (e.g., a needle valve). A pressure of the LT buffer 104 was maintained between 15 to 20 kPa by using the pressure control device 108 (e.g., an automated valve) connected to a control mechanism (not shown), such as a PLC. 0.5 L/min (i.e., 500 sccm) of $MoO_2Cl_2$ gas flow is controlled by using single MFC 116 which has a max operation temperature at 150° C. FIG. 6 is a diagram of time dependence of flow rate of the vapor of the precursor at 170° C.

Example 4

Figure 4:
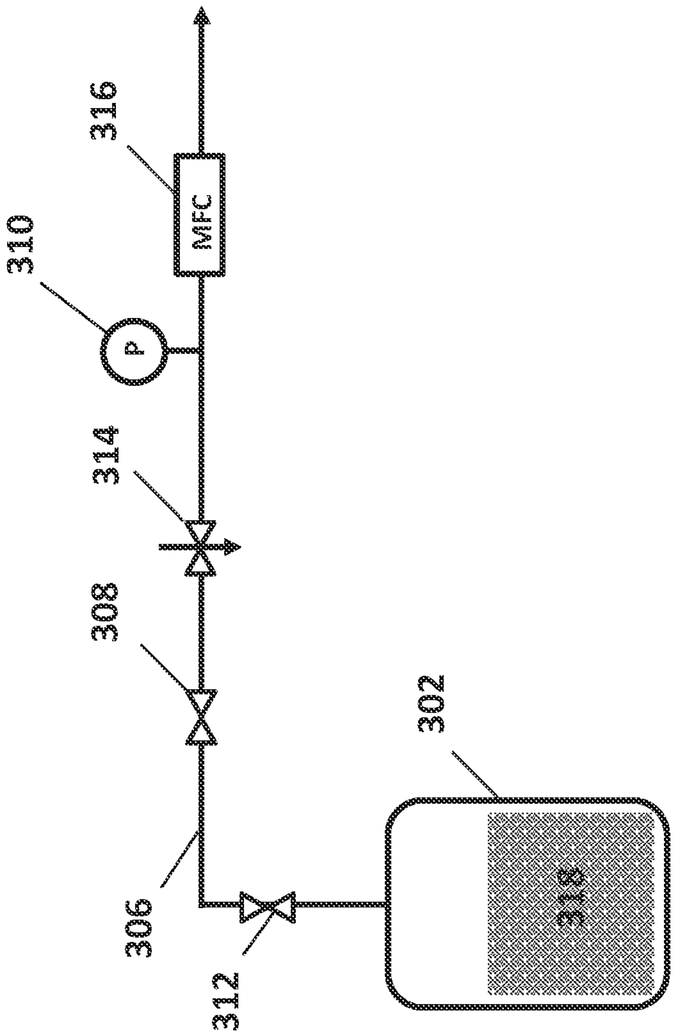
FIG. 4 is a schematic block diagram of another exemplary embodiment of the disclosed supply system for low volatility precursors.
Figure 7:
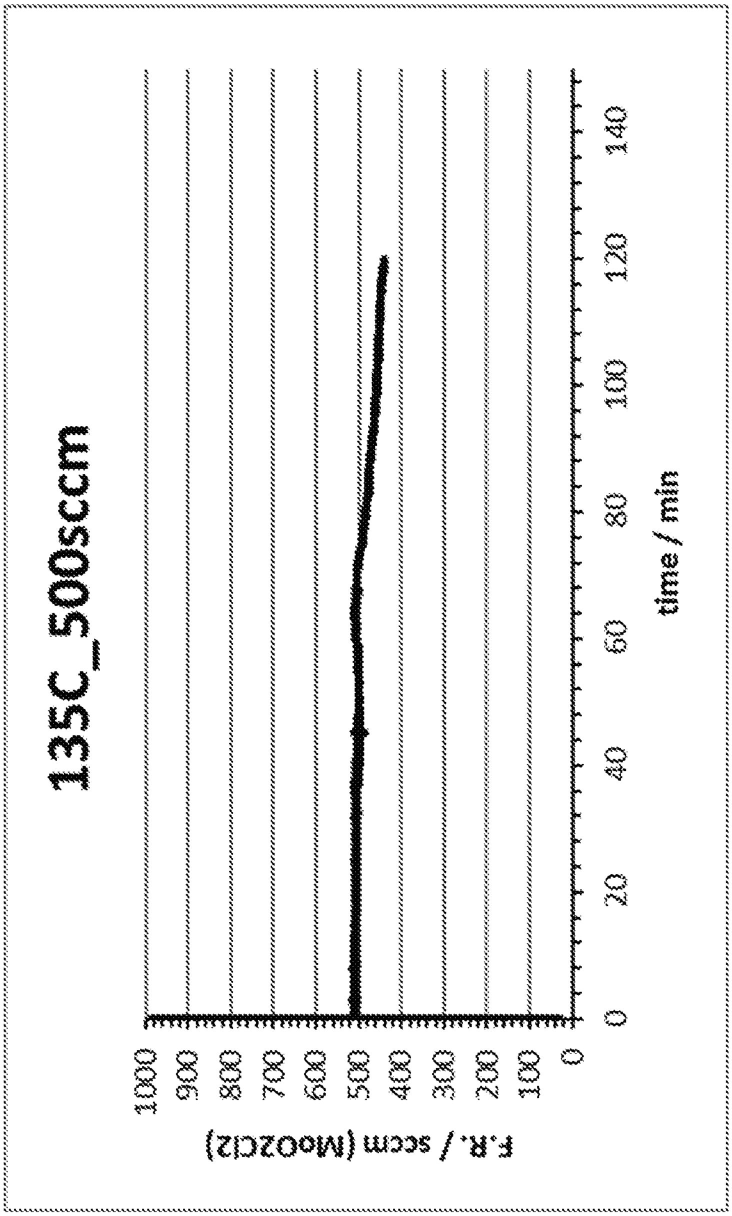
FIG. 7 is a diagram of time dependence of flow rate of the vapor of the precursor at 135° C. and flow rate of 500 sccm.

Referring to FIG. 4, $MoO_2Cl_2$ was stored in the HT vessel 302 heated at 135° C. $MoO_2Cl_2$ gas is directly introduced into a single MFC 316 after pass through the pressure reduction device 314 (e.g., a needle valve) and the pressure control device 308 (e.g., an automated valve) connected to a control mechanism (not shown), such as a PLC. The difference between FIG. 1 and FIG. 4 is there is no LT buffer in FIG. 4. 0.5 L/rain (i.e., 500 sccm) of $MoO_2Cl_2$ gas flow is confirmed for 60 min, and then decreased. FIG. 7 is a diagram of time dependence of flow rate of the vapor of the precursor at 135° C.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A system for dispensing a vapor of a precursor to a point of use, the system comprising:

a) a first vessel containing the precursor and configured and adapted to heat the precursor to a temperature that results in a precursor vapor pressure of more than approximately 10 kPa therein;

b) a second vessel being configured and adapted to heat a precursor vapor therein to a temperature ranging from room temperature to a maximum temperature limitation of a flow control device fluidically connected thereto;

c) a first gas conduit fluidically connecting the first vessel to the second vessel, wherein a pressure reduction device and a pressure control device are fluidically connected to the first gas conduit;

d) a second gas conduit fluidically connecting the second vessel to the point of use, wherein the flow control device, configured and adapted to regulate a flow rate of the precursor vapor delivered to the point of use, is fluidically connected to the second vessel and the point of use; and e) a pressure gauge operably connected to the second vessel and configured and adapted to measure a partial pressure of the precursor vapor in the second vessel, wherein the system is further configured and adapted to maintain the partial pressure of the precursor in the second vessel (i) at a pressure lower than a saturated vapor pressure of the precursor at a temperature of the second vessel and (ii) at a pressure higher than a minimum inlet pressure requirement of the flow control device, wherein the second vessel contains at least one dip tube that connects to an outlet port of the second vessel, wherein the outlet port is located in the top of the second vessel or located in the bottom of the second vessel, wherein the system is further configured to maintain the partial pressure of the precursor in each of the first vessel and the second vessel, the partial pressures are equal to the respective total pressure therein without adding a carrier gas to the precursor vapor in the first vessel and the second vessel.

2. The system of claim 1, wherein the system is further configured and adapted to maintain the temperature of the first vessel to a temperature that maintains a pre-defined precursor vapor pressure with the first vessel based on the partial pressure of the precursor in the first vessel.

3. The system of claim 1, wherein the pressure reduction device is selected from an orifice, a needle valve, a capillary tube, or a valve, configured and adapted to be capable of isolating the first vessel from the second vessel.

4. The system of claim 1, wherein the first and second gas conduits are configured and adapted to be heated to maintain a temperature higher than a local condensation temperature of the precursor vapor.

* * * * *